United States Patent
Hoebener et al.

[11] Patent Number: 5,825,629
[45] Date of Patent: Oct. 20, 1998

[54] PRINT CIRCUIT BOARD PRODUCT WITH STENCIL CONTROLLED FINE PITCH SOLDER FORMATION FOR FINE AND COARSE PITCH COMPONENT ATTACHMENT

[75] Inventors: Karl Grant Hoebener, Georgetown; Eric Max Hubacher; Julian Peter Partridge, both of Austin, all of Tex.

[73] Assignees: International Business Machines Corporation, Armonk, N.Y.; Motorola, Inc., Shaumburg, Ill.

[21] Appl. No.: 709,674

[22] Filed: Sep. 9, 1996

Related U.S. Application Data

[60] Continuation of Ser. No. 453,028, May 30, 1995, abandoned, which is a division of Ser. No. 298,983, Aug. 31, 1994, Pat. No. 5,492,266.

[51] Int. Cl.$^6$ .............................. H05K 1/03; H05K 1/09; H05K 1/11; H05K 7/02
[52] U.S. Cl. .................... 361/777; 174/261; 228/180.21; 228/180.22; 361/760; 361/774
[58] Field of Search ..................................... 174/260, 261; 228/179.1, 180.1, 180.21, 180.22; 257/723, 724, 786; 361/760, 772, 773, 777, 779, 783, 774; 437/209; 439/68, 83; 438/129, 108, 597, 612, 613, 369

[56] References Cited

U.S. PATENT DOCUMENTS

| | | |
|---|---|---|
| 4,722,470 | 2/1988 | Johary . |
| 4,761,881 | 8/1988 | Bora et al. ............................... 361/760 |
| 5,060,844 | 10/1991 | Behun et al. . |
| 5,147,084 | 9/1992 | Behun et al. . |
| 5,373,984 | 12/1994 | Wentworth .......................... 228/180.21 |
| 5,400,953 | 3/1995 | Maeno . |
| 5,492,266 | 2/1996 | Hoebener et al. .................. 228/180.22 |
| 5,493,075 | 2/1996 | Chong et al. ............................. 174/260 |
| 5,498,575 | 3/1996 | Onishi et al. ............................ 438/612 |
| 5,535,936 | 7/1996 | Chong et al. ....................... 228/180.22 |

FOREIGN PATENT DOCUMENTS

| | | |
|---|---|---|
| 3608101 | 9/1987 | Germany . |
| 86679 | 6/1980 | Japan . |
| 3241889 | 10/1991 | Japan . |
| WO 8606243 | 10/1986 | WIPO ................................. 228/180.1 |

OTHER PUBLICATIONS

IBM TDB, vol. 37, No. 02B, Feb. 1994, Improvements in the Sacrificial Substrate Burn–In Methodology for Known Good Die, pp. 19–20.

IBM TDB, vol. 30, No. 7, Dec. 1987, Fine Pitch Printing for Surface Mounted Technology, pp. 314–315.

Research Disclosure, Nov. 1988, No. 295, "Solder Mask Elimination on Printed Circuit Boards".

(List continued on next page.)

*Primary Examiner*—Donald Sparks
*Attorney, Agent, or Firm*—Casimer K. Salys

[57] ABSTRACT

A product created through the reflow of low melting point solder on select contacts of a printed circuit board. In one form, the printed circuit board has fine pitch devices, including flip-chip integrated circuits, connected to a board having conventional coarse pitch surface. The fine pitch contacts of the board are exposed through holes in a stencil characterized in its ability to withstand solder reflow temperatures, not be wettable by solder, and have a coefficient of thermal expansion relatively matching the printed circuit board. Low temperature solder paste is screen deposited into the stencil openings. With the stencil fixedly positioned on the board, the solder paste retained by the stencil pattern is reflowed to selectively form on the underlying contacts of the printed circuit board. Thereafter, the stencil is removed from the board and the board is subject to previously practiced depositions of flux and paste in preparation for fine and coarse pitch component placement and ensuing solder reflow. The fine contact pitch and coarse contact pitch differ by nominal factor of two or more.

1 Claim, 6 Drawing Sheets

OTHER PUBLICATIONS

Research Disclosure, Feb. 1992, No. 334, "Ladder Pattern for Soldering Circuit Board Ground Pads".

Sandia National Laboratories, DE93 009631, "A Maskless Flip–Chip Solder Bumping Technique", Chu et al.

*Circuits Assembly,* Feb. 1993, "A Step in the Right Direction", Payne et al, pp. 59–64.

IBM TDB, vol. 36, No. 02, Feb. 1993, Solder Preform Technique for Fine Pitch Surface Mount Technology Components, pp. 397–398.

PRINT CIRCUIT BOARD PRODUCT WITH STENCIL CONTROLLED FINE PITCH SOLDER FORMATION FOR FINE AND COARSE PITCH COMPONENT ATTACHMENT

This is a continuation of application Ser. No. 08/453,028 filed May 30, 1995, now abandoned. which is a divisional of application Ser. No. 08/298,983 filed on Aug. 31, 1994 now U.S. Pat No. 5,492,266.

BACKGROUND OF THE INVENTION

The present invention is generally directed to printed circuit board processes and products. More particularly, the invention relates to the formation of fine pitch solder deposits on printed circuit boards.

Surface mount technology is now routinely used to attach packaged integrated circuit devices to printed circuit boards. In general, the practice involves the application of solder paste to copper contacts of the printed circuit board through a stencil patterned with openings corresponding to the board contact locations. The solder paste is screen deposited in patterns on the printed circuit boards using the stencil as a mask and a doctor blade to squeegee the solder paste through the holes in the stencil. When the stencil is removed, the solder paste remains on the printed circuit board contacts.

Since the solder paste is typically 50% flux by volume, with the other 50% being particles of solder, the paste is also used to hold the component terminals in place during the solder reflow step which follows. The eutectic low melting point solder (63% tin, 37% lead-63/37) normally used permits reflow and a concurrent bonding of the component terminals to the printed circuit board contact at a temperature (below 250 deg. C.) compatible with the glass transition capabilities of flame retardant level 4 (FR4) printed circuit board materials.

The spacing of the leads for packaged integrated circuit components typically exhibit a pitch no finer than 16 mils. This capability is consistent with conventional surface mount technology (SMT) processes using screen deposited solder paste to hold and connect the packaged integrated circuit devices to printed circuit boards.

An integrated circuit connection technology using finer, less than 16 mil, pitch has been developed and is being used with advanced computer systems. The technology is generally known as flip-chip attachment, otherwise technically identified as controlled collapse chip connection (C4). Instead of attaching the integrated circuit die to a lead frame in a package having the leads or pins for mounting, the C4 design involves the formation of an array of solder balls on the surface of the integrated circuit die itself. The solder balls are composed of high melting point solder (3% tin, 97% lead-3/97) at an approximate pitch of 10 mils. The C4 die are designed to be connected to a ceramic substrate, in contrast to a printed circuit board, involving a controlled collapse solder reflow process accomplished at approximately 350 deg. C. This temperature is suitable for the silicon die and ceramic substrate, but not for a printed circuit board.

The high connection count and density of the flip-chip device design makes it particularly attractive for advanced printed circuit board products with numerous integrated circuit chips and extended functionality. This candidacy is reinforced by the fact that photolithographic processes used to form conductive contact patterns on modern printed circuit boards have the capability to create correspondingly fine pitch patterns. Unfortunately, attempts to screen solder paste in the fine pitch characterizing the flip-chip device has proven unsuccessful, in that some of the solder paste lifts off with the stencil, resulting in a non-uniform deposit. These phenomena are attributed to the stencil opening aspect ratio (diameter to thickness), solder paste viscosity and rheology, paste formulation, solder paste particle diameter, and stencil material properties. The diameter of the hole is driven by the fine pitch of the flip-chip device, while the thickness is dictated by the need for a minimum volume of solder to connect the ball on the die to the copper contact of the printed circuit board. Experience indicates that approximately 20–80 cubic mils of solder are needed for a nominal 4 mil wide printed circuit board contact to attain reliable connection between the ball of the flip-chip device and the copper contact.

In the absence of an effective solder paste screening process for depositing solder onto fine pitch printed circuit board contacts, the users of flip-chip device on printed circuit boards have developed two techniques for depositing low melting point solder on fine pitch printed circuit board contacts. The first process uses masking and electroplating to deposit the solder. This process includes the formation of a photolithographically defined mask, an electroplate bath deposition of low melting point solder on printed circuit board contacts not covered by the mask, a removal of the mask, and a reflow of the electroplated solder. The process involves numerous steps and has an associated high cost.

The other approach developed to selectively form low melting point solder on the fine pitch contacts of printed circuit boards involves the injection of molten solder through a dispensing head with a mask corresponding to the copper contact pattern of the printed circuit board. Unfortunately, the molten solder dispensing head is very expensive, requires a distinct mask for each different flip-chip device footprint, and dispenses the solder to the contacts of only one die location at a time.

In the context of this known technology, there remains the need for a process, and product formed thereby, which will deposit a low melting point solder on a fine pitch printed circuit board contact pattern within the framework of conventional screened solder paste deposition processes while providing solder volumes on respective contacts adequate to connect conventional SMT components and flip-chip devices.

SUMMARY OF THE INVENTION

The present invention relates to an intermediate level printed circuit board product, comprising a dielectric structure core, a conductive interconnect layer with fine and course pitch contacts configured to connect surface mounted components of corresponding contact pitch on at least one surface of the dielectric structure core, solder reflowed onto conductive layer fine pitch contacts as defined by openings in a first stencil, the reflowed solder characterized in having an origin composition of solder paste screen deposited into fine pitch openings in the first stencil and further characterized in having a shape constrained by a reflow performed at an elevated temperature in the presence of the first stencil, solder paste screen deposited on conductive layer coarse pitch contacts as defined by coarse pitch openings in a second stencil, having a pattern different than the first stencil, during a solder paste screen deposition following removal of the first stencil, wherein the fine pitch contacts formed using the first stencil are finer by a factor of two or more than the coarse pitch contacts defined by the solder paste deposited using the second stencil, first components affixed to select conductive layer fine pitch contacts using flux deposited on the reflowed solder, and second components affixed to select conductive layer coarse pitch contacts using the screen deposited solder paste as defined by the second stencil.

According to one practice of the invention, a printed circuit board, composed of FR4 or bismaleimide triazine (BT) resin having both fine and coarse pitch contact patterns (differing in pitch by a factor of two or more) is covered by a stencil composed of a material not wettable by solder. Low melting point solder paste is screen deposited through the holes in the stencil as aligned to the copper contacts of the underlying printed circuit board. The stencil remains fixed in place as the solder is reflowed and thereby deposited onto the copper contacts. The stencil is then removed from the printed circuit board. Flux is deposited on the fine pitch contact pattern of deposited solder while the coarse pitch contact patterns are subject to a screen deposition through a coarse pattern stencil using solder paste. Component placement and reflow follow in normal manner.

The invention allows formation of low melting point solder balls on fine pitch printed circuit board contact patterns particularly suited for use with flip-chip or other fine pitch components. The low temperature solder balls formed on the printed circuit board contacts reflow and connect the high melting point flip-chip solder balls. The flip-chip solder balls remain virtually intact during reflow, thereby providing a standoff height between the printed circuit board contact and the silicon die adequate to ensure a reliable attachment in the presence of a significant difference in coefficient of thermal expansion between the printed circuit board and the silicon die.

These and other features of the invention will be more clearly understood and recognized upon considering the detailed description which follows.

DETAILED DESCRIPTION OF THE PREFERRED EMBODIMENT

Figure 1:
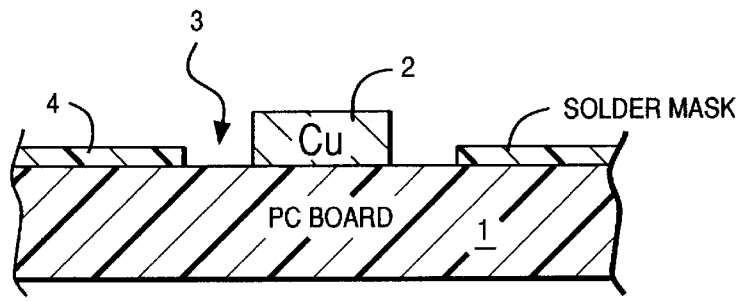
FIGS. 1–5 depict by schematic cross-section, various stages in a prior art method of forming low melting point solder on fine pitch printed circuit board contacts.
Figure 2:
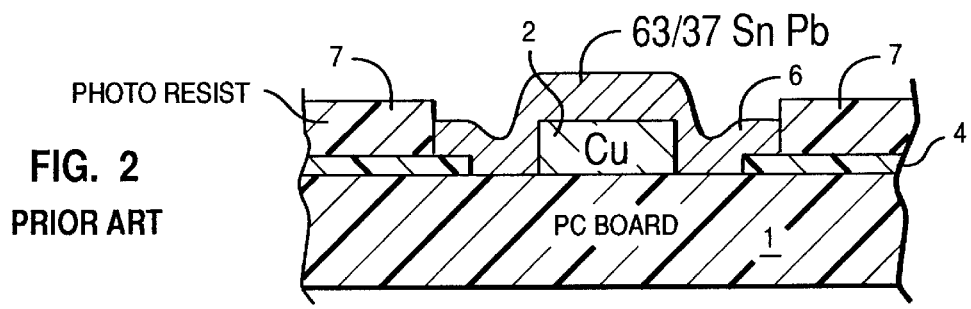
Figure 3:
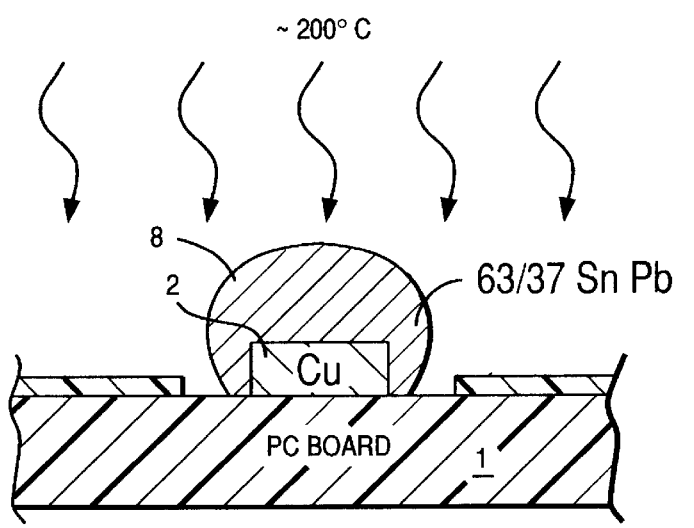

FIGS. 1–3 summarize the key operations in the prior art plating method for depositing low melting point solder onto fine pitch printed circuit board contacts. Printed circuit board 1, having a dielectric core material, is shown to include at least one contact 2 on at least one surface 3 of the board. Contact 2 is a copper trace on the board, a layer of copper selectively patterned by conventional photolithographic processes. A fine pitch contemporary printed circuit board contact will typically be approximately 1.5 mils thick and approximately 4 mils in width or diameter. A conventional solder mask 4 is formed by photolithographic process to cover all but the copper contact and immediately adjacent printed circuit board surfaces.

The printed circuit board is coated with a thin metal commoning layer (not specifically shown) to prepare the board for plating and is then covered by a photoresist layer. After photolithographic processing, photoresist mask 7 allows Sn—Pb electroplating 6 on contact 2 and the area around the contact. The photoresist mask is then removed and the printed circuit board is subject to a low temperature, approximately 200 deg. C., reflow heating to shape and condition solder 8 into a ball-like deposit over contact 2 as shown in FIG. 3.

Experience has shown that the resulting deposit of low temperature solder 8 must nominally be in the range of 20–80 cubic mils for a nominal 4 mil contact to allow reliable connection to the balls of a flip-chip die.

Figure 4:
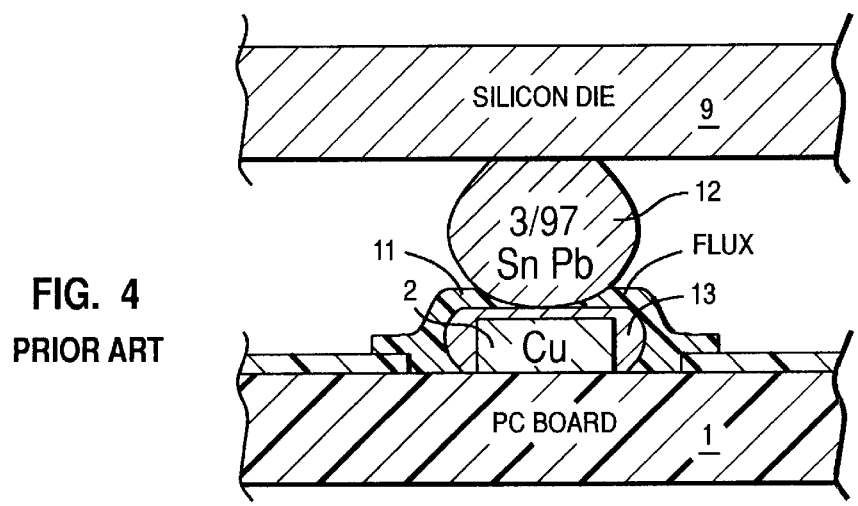

FIG. 4 illustrates the next step, the placement of silicon die 9 into solder flux 11 as deposited onto the region of contact 2. Silicon die 9 has attached thereto a multiplicity of fine pitch balls or bumps 12, individually bonded to regions of the silicon die and composed of high melting point solder, typically 3/97 (Sn/Pb) with a melting temperature of approximately 350 deg. C. Obviously, bumps 12 of die 9 are in a pattern which matches contacts 2 of board 1. Low melting point solder 8 as formed in FIG. 3 is flattened as 13 in FIG. 4 before the deposition of flux 11 and placement of die 9. The flat upper surface and flux 11 minimize lateral movements of the silicon die as might otherwise occur from contacting curved surfaces C4 solder bump 12 is not suitable for direct connection to contact 2 because its 350 deg. C. melting point is far above the glass transition temperature of printed circuit board 1. Additionally, bump 12 provides the aforementioned standoff between the significantly different coefficients of thermal expansions characterizing silicon die 9 and printed circuit board 1.

Figure 5:
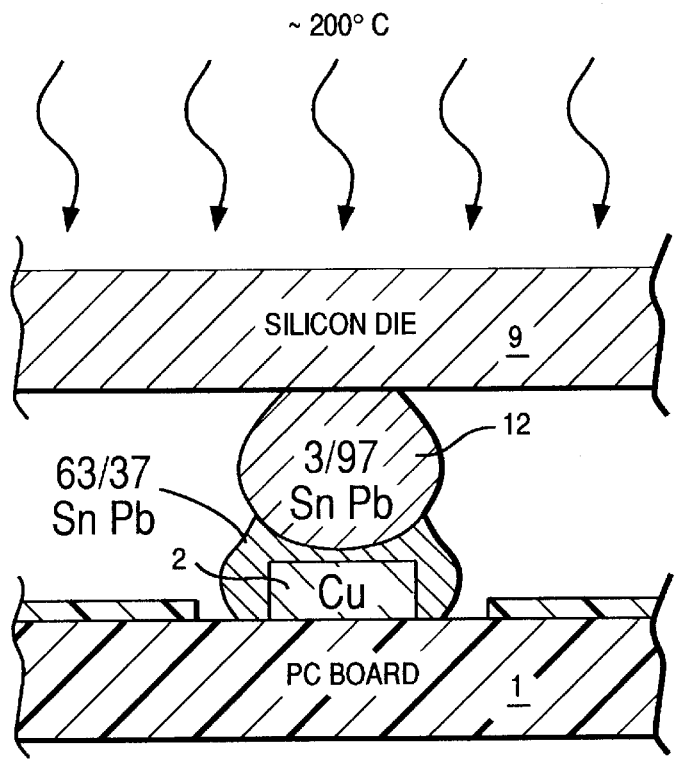

A concluding reflow of the low melting point solder produces the structure depicted in FIG. 5.

Figure 6:
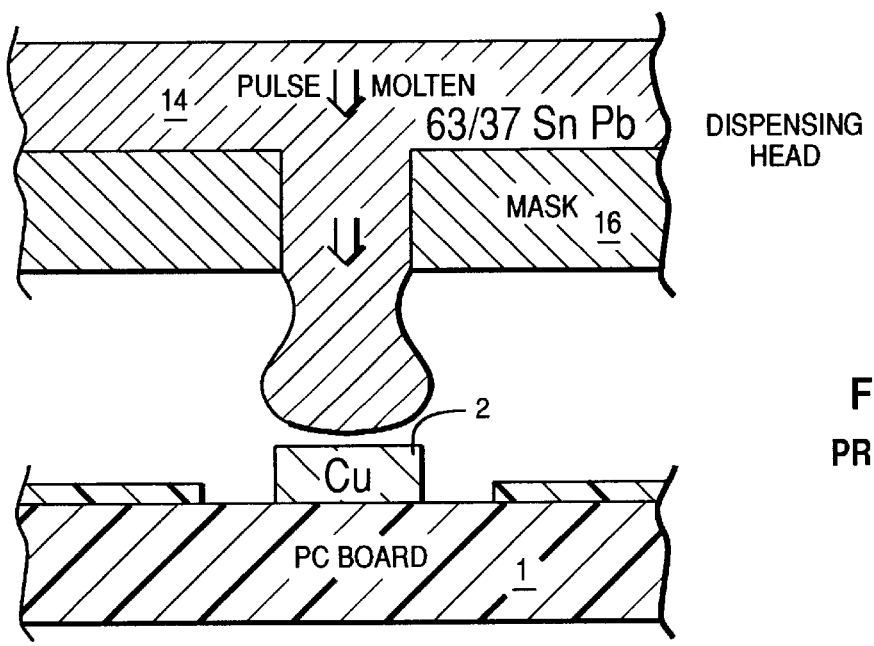
FIG. 6 depicts by schematic cross-section, a prior art practice of dispensing low melting point solder by molten injection onto fine pitch patterns of a printed circuit board contacts.

FIG. 6 depicts by schematic cross-section another known technique for depositing low melting point solder onto fine pitch printed circuit board contacts. As shown, molten low melting point solder 14 is injected through a mask 16, matching the pattern of the fine pitch contacts, to produce deposits of low melting point solder analogous to 8 in FIG. 3. Once the solder is so deposited, the prior art procedures described with reference to FIGS. 4 and 5 follow to electrically connect bump 12 of silicon die 9 to contact 2 of printed circuit board 1 by low temperature reflow heating. As might be expected with injecting 20–80 cubic mil volumes of solder onto 4 mil size contacts, at nominal fine contact pitch spacings of 10 mils, this involves complex and expensive equipment, requires head changes for each different mask pattern, and die pattern by die pattern dispensing of the solder onto the board contacts.

Figure 7:
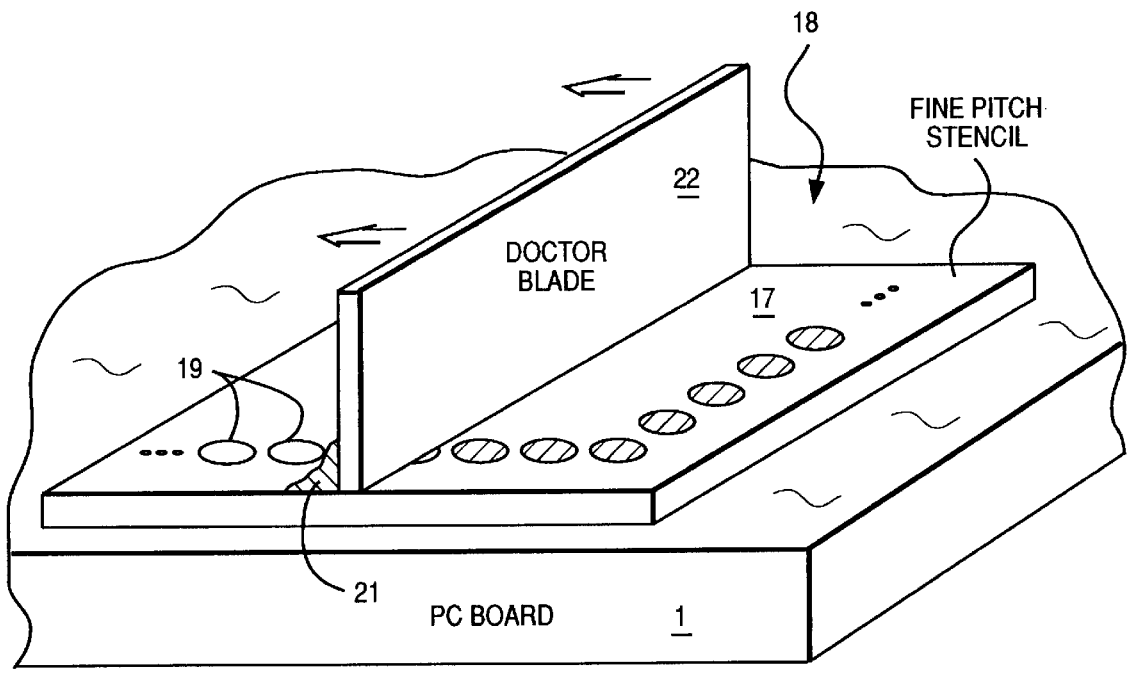
FIG. 7 is a perspective view schematically depicting the screening of low melting point solder paste through a fine pitch stencil, in accordance with the present invention.
Figure 10:
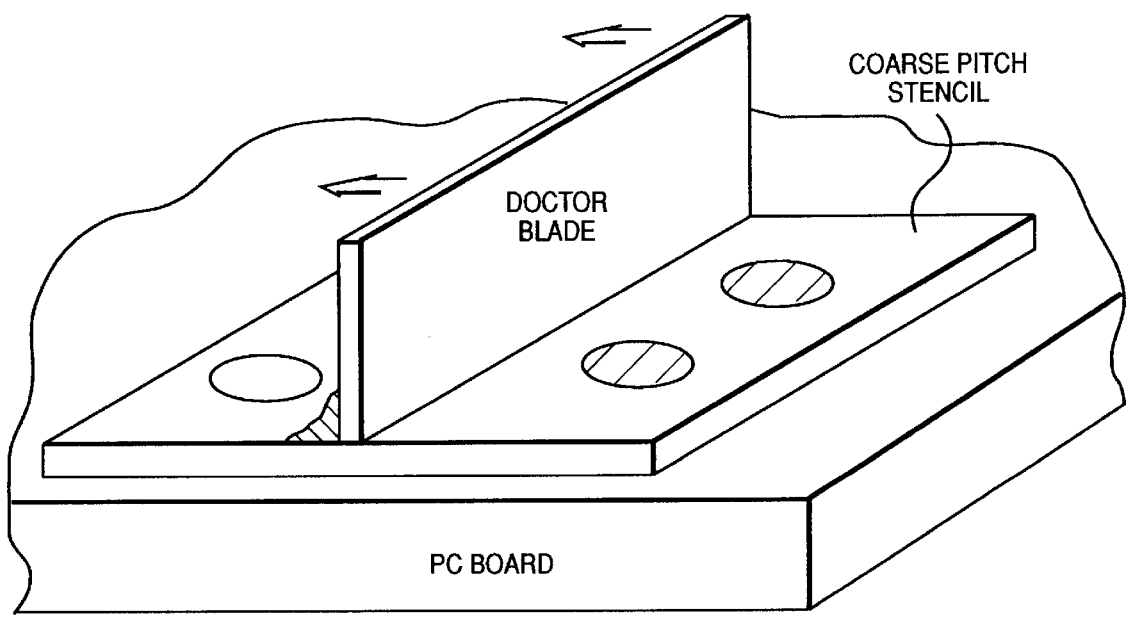
FIG. 10 is a perspective view schematically depicting the screening of low melting point solder paste through a coarse pitch stencil, in accordance with the present invention.

The present invention avoids the complex plating operations and equipment requirements associated with the prior art deposition of low melting point solder in fine pitch patterns on a printed circuit board. A preferred practice of the invention begins as shown in FIG. 7 with the aligned placement of fine pitch stencil 17 onto surface 18 of patterned printed circuit board 1. Surface 18 of the board includes the copper contacts to which stencil 17 is aligned as well as the selectively patterned solder mask layer 4. See FIG. 8. Stencil 17 is preferably 1 to 5 mils thick and has etched therein 4–7 mil diameter holes 19 patterned to match the contacts of printed circuit board 1. Stencil 17 is preferably composed of a material not wettable by solder, such as molybdenum, stainless steel, or chrome plated steel. Molybdenum is preferred in that it is easily etched with accurate patterns and has demonstrated suitability for forming high temperature solder balls 12 on silicon die 9. The key virtues required of stencil 17 are that it not be wettable by solder, that it be capable of withstanding a reflow temperature which expected to be approximately 250 deg. C., that it have a coefficient of thermal expansion relatively close to the printed circuit board, and that it be capable of contouring to match the surface of the printed circuit board as the board tolerances provide. The importance of these factors will become evident as the details of the process are developed.

Stencil 17 may be affixed to printed circuit board 1 in a variety of manners. For example, the stencil may be visually or mechanically aligned and then mechanically clamped into that position. An alternate approach is to use a vacuum to hold the stencil in the aligned position, wherein the vacuum is preferably maintained throughout a subsequent reflow operation. Furthermore, the weight of the stencil itself (or with additional weights) may create sufficient contact to the printed circuit board.

With stencil 17 aligned to and fixed in location on surface 18 of printed circuit board 1, low melting point solder paste 21 is squeezed into holes 19 of stencil 17 using doctor blade 22. Other solder paste screening equipment can obviously be used in place of doctor blade 22.

Figure 8:
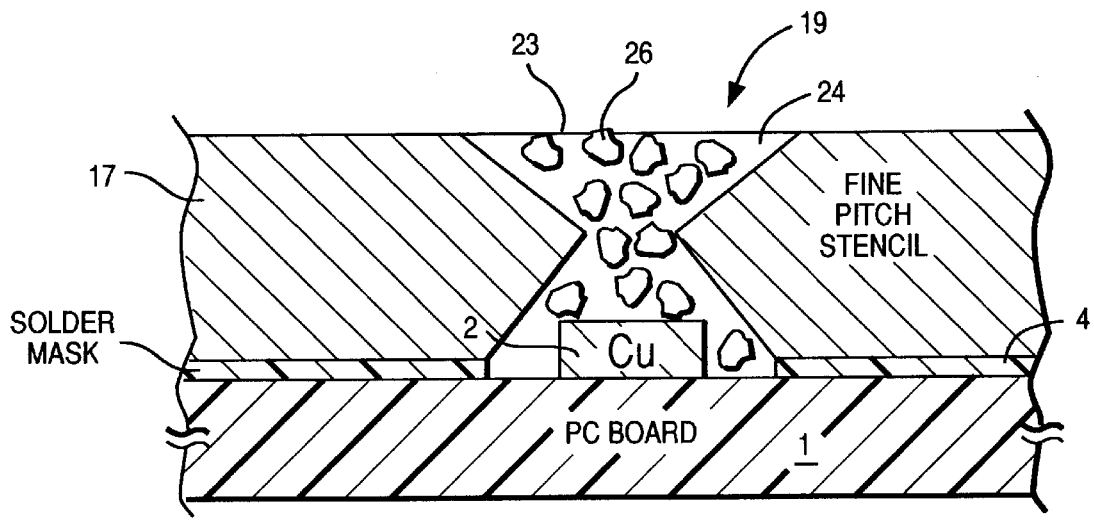
FIG. 8 shows a schematic cross-section of a fine pitch contact screened with solder paste, in accordance with the present invention.

FIG. 8 depicts by schematic cross-section one suitable appearance of a hole 19 in stencil 17 above printed circuit board contact 2. Note that stencil 17 is in intimate contact with solder mask 4 in the region proximate to contact 2. The hole 19 through stencil 17 may not be perfectly cylindrical. Rather, it is more likely to exhibit tapers as shown in FIG. 8 introduced during the etching used to create holes 19. The tapers shown in FIG. 8 are representative of a molybdenum stencil which has been etched from both sides during the hole formation. Tests to date have confirmed that the shape of the hole has an effect on the volume and formation consistency of the low melting point solder deposited onto contact 2. However, the optimum shape has yet to be defined, and is likely to be related to the material used for the stencil, the thickness of the stencil, the size of the contact, and the composition and rheology of the solder paste.

FIG. 8 shows that hole 19 in stencil 17 is filled with solder paste deposit 23. Paste deposit 23 is composed of a mixture including flux 24 and a multiplicity of solder balls 26 suspended in the flux. The solder balls are of a melting temperature consistent with printed circuit board 1, which for FR4 or BT resin board material involves a 63/37 (Sn/Pb) composition with a melting temperature of approximately 200 deg. C. For the embodiment described, the diameter of solder balls 26 is preferably less than 1 mil. Note that the volume of flux to solder balls is an important variable. Presently a volume ratio of about 50/50 is suitable.

The next step in the fabrication process according to the present invention is a reflow of the solder paste deposit 23 to melt and form the solder onto contact 2. In contrast to conventional practices, stencil 17 remains in place during the fine pitch reflow operation schematically depicted in FIG. 9. Reflow of the screened paste in the presence of stencil 17 ensures that the volume of solder deposited from paste deposit 23 in hole 19 is transferred to contact 2 upon reflow. Recall that reliable bonding of component terminals, whether they involve flip-chip devices or otherwise, requires controlled amounts of low temperature solder. The high aspect ratio hole needed for the volume of solder increases the likelihood that all or part of the paste will be lifted if stencil 17 is removed before reflow. The reflow of paste in the presence of the mask controllably deposits a specified volume of low melting point solder onto the fine pitch contacts.

Figure 9:
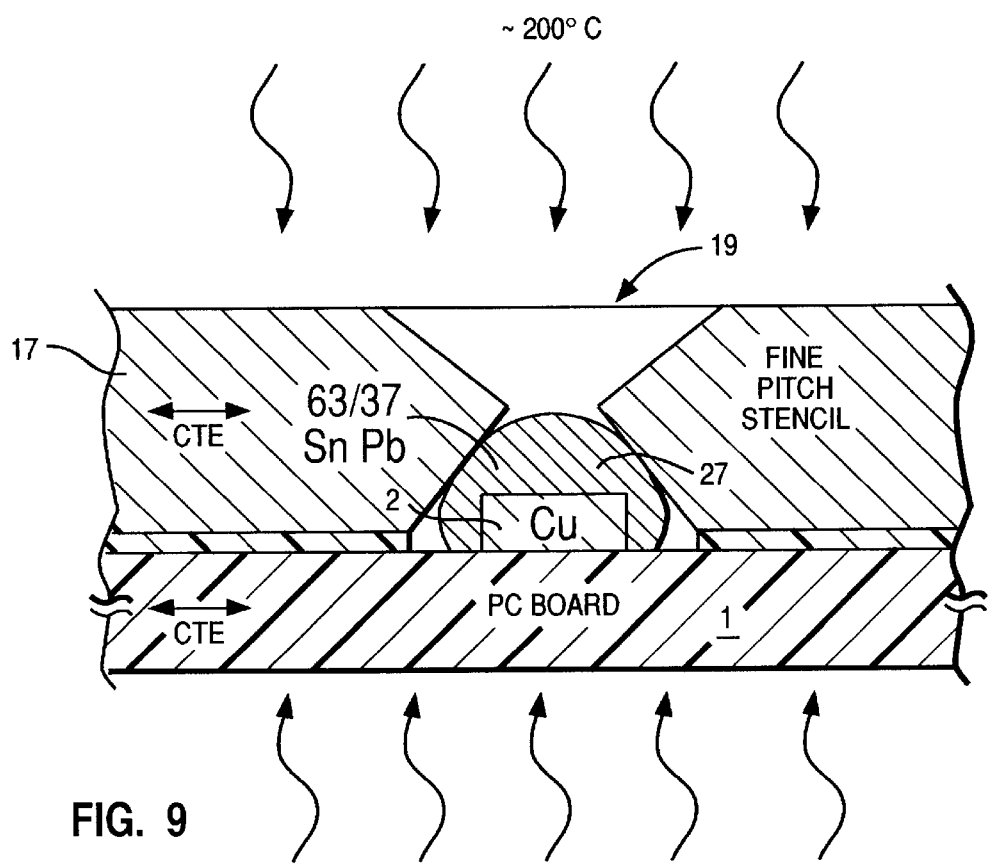
FIG. 9 shows a schematic cross-section of the fine pitch contact following reflow of the low melting point solder paste in the presence of the stencil, in accordance with the present invention.

As depicted in FIG. 9, the reflow in the presence of stencil 17 causes the low temperature solder 27 to form onto contact 2. Given that reflow is accomplished at approximately 200 deg. C., it is important that the coefficient of thermal expansion exhibited by stencil 17 relatively match the coefficient of thermal expansion of printed circuit board 1 if the fine pitch alignment and intimate contact are to be maintained as the temperature changes. FR4 printed circuit board material exhibits a nominal coefficient of thermal expansion ranging between 15–20 ppm/deg. C. BT resin printed circuit board material exhibits a nominal coefficient of thermal expansion ranging between 10–20 ppm/deg. C. depending on what glass cloth material is included in the substrate. Molybdenum, the presently preferred stencil material, exhibits a coefficient of thermal expansion in the range of 8–9 ppm/deg. C. Stainless steel, with a coefficient of thermal expansion nominal 12–14 ppm/deg. C., exhibits a potentially better match for the FR4 material boards. Irrespective of which mask material is selected, the mask must be able to withstand the reflow temperature, must maintain relative alignment, and must be non-solder wettable.

Sending the printed circuit board and attached stencil through an oven to reflow the solder suspended in the paste causes the solder to wick onto copper contact 2 and to retract from non-wettable stencil 17 as illustrated in FIG. 9, leaving all the solder deposited on the contact 2. After cooling, stencil 17 is removed from board 1, leaving solder deposit 27 intact.

According to a preferred practice of the invention, low melting point solder deposits 27 are subject to a flattening operation using a mechanical flattening tool, such as a press with a flat plate, prior to attaching the flip-chip die. The flat surface of the solder reduces the likelihood of lateral movement in the silicon die as a result of the balls of the silicon die interacting with curved surface of solder deposit 27.

Printed circuit boards will likely continue to use some coarse pitch surface mount devices. Course and fine pitch patterns typically differ by a factor greater than two. When course pitch devices are to be attached, the invention involves the deposition of flux 30 over flattened solder deposit 35 covering the fine pitch contact, using any conventional technique, and a screening of solder paste for the coarse pitch contacts of the board. See the depictions in FIG.

Figure 11:
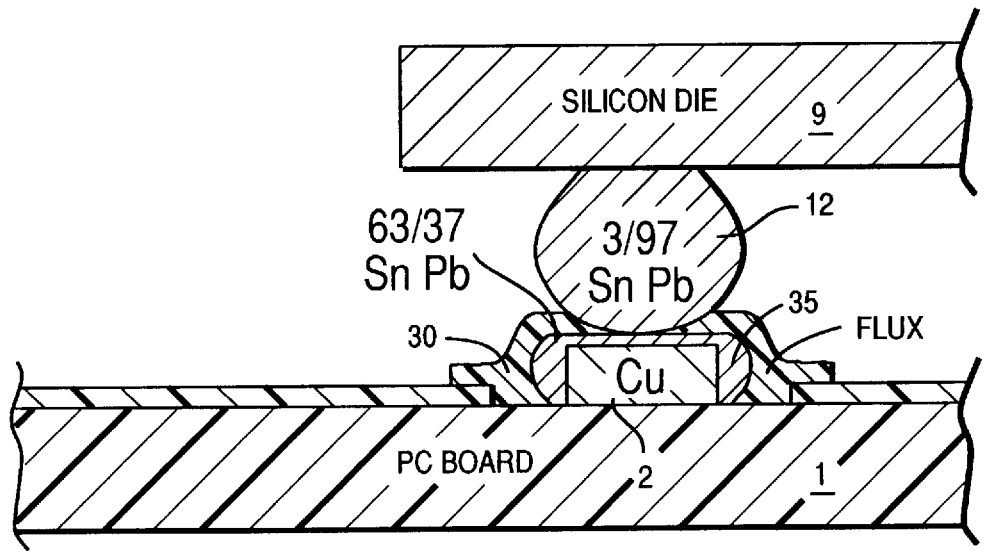
FIG. 11 shows by schematic cross-section the placement of a flip-chip silicon die into flux deposited on the fine pitch contact, in accordance with the present invention.
Figure 12:
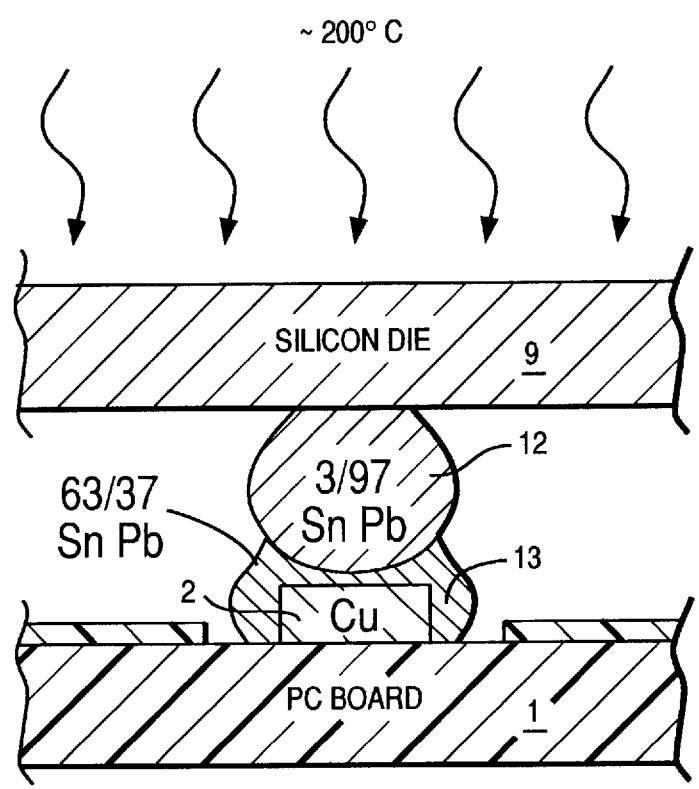
FIG. 12 depicts by schematic cross-section the connection of a flip-chip silicon die to a fine pitch contact of the printed circuit board upon reflow of the low melting point solder formed on the contact, in accordance with the present invention.

10 and 11. At the conclusion of these operations, the printed circuit board has solder paste deposited on the coarse pitch contacts and solder flux deposited over solder formed onto the fine pitch contacts. During the final reflow process, flux 30 holds the fine pitch components in position. FIG. 11 shows flux 30 holding ball 12 of flip-chip silicon die 9 in position over flattened solder formation 35. The solder paste holds, and eventually provides the solder for, the coarse pitch components placed on the board. As illustrated in FIG. 12, the electrical connection between contact 2 and ball 12 of silicon die 9 is accomplished during the reflow. Course pitch components are likewise connected at this stage.

Figure 13:
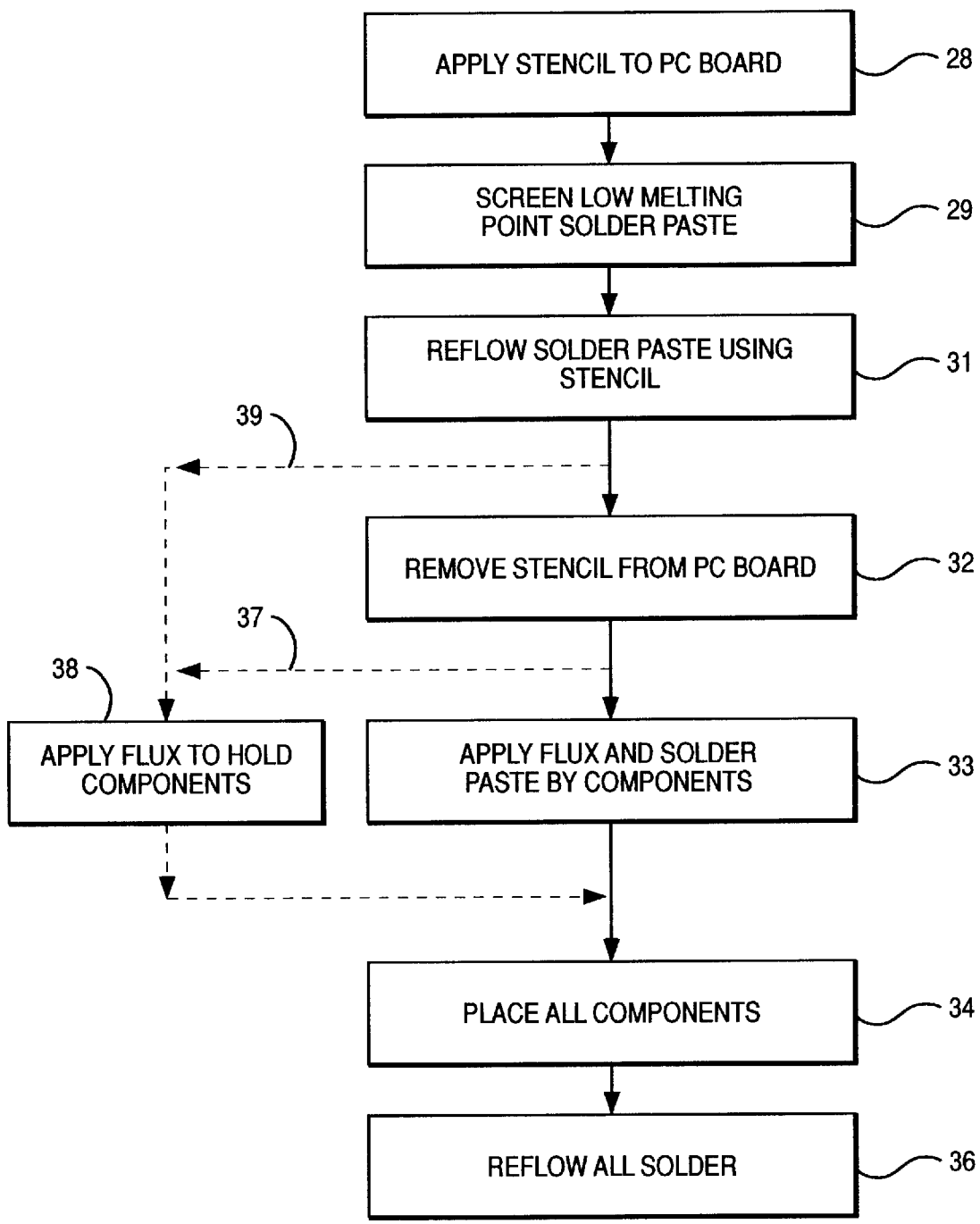
FIG. 13 provides a flow chart characterizing the processes of the present invention, in accordance with the present invention.

FIG. 13 sets forth by flow chart the operations characterizing selected embodiments of the present invention. The lines and blocks shown by dashes indicate alternate practices. The practice begins with the application of the fine pitch stencil to the printed circuit board, 28, followed by the screening of low melting point solder paste, 29, and a reflow of the solder paste in the presence of the stencil, 31. The stencil is then removed, 32, followed by an application of flux and paste as appropriate for the fine and coarse pitch contacts, 33, followed, thereafter, in succession by the placement of the components, 34, and final reflow of all solder, 36. Obviously, if one is only fabricating a bumped board suitable for later surface mount device attachment, the operations would cease with the reflow of the solder paste in the presence of the stencil, 31, and where appropriate, the removal of the stencil from the printed circuit board, 32.

The alternate embodiment introduced by dashed line 37 and associated block 38 involves a practice of the invention in which both the fine pitch and coarse pitch contacts are screened using the same stencil. The flux applied to all contacts in block 38 serves primarily to hold the components during the final reflow operation. The use of a common stencil for both the fine and coarse pitch contacts may result in less than normal solder volume for the coarse pitch contacts. However, it is anticipated that any such variations or problems can be overcome through process optimization. The solder formed on the coarse pitch contacts may not have to be flattened in preparation for component placement.

The other alternative, as defined by dashed line 39, involves the practice of the invention in which the stencil is not removed following reflow of the solder paste. This practice will likely involve the screening of paste for both fine and coarse pitch contacts using the common stencil, and the use of the flux to hold the components during final reflow step 36. A variety of high temperature polymeric materials exist which are usable to 200 deg. C., non-solder wettable, and have coefficients of thermal expansion generally compatible with printed circuit board materials.

The procedures defined by the flow chart in the FIG. 13 are of course amenable to conventional changes, such as by the use of adhesive in place of flux or paste to fix components during final reflow step 36. However, the use of such adhesives may not be desired for use with fine pitch contact components in that the trend in such components is to attach silicon die using a full ball grid array of contacts, rather than merely a peripheral distribution of such contacts.

The evolution of printed circuit board technology is expected to provide board materials exhibiting higher temperature capabilities and lower coefficients of thermal expansion. These developments will obviously impact the choice of stencil materials and dimensions. Likewise, the higher temperature capability printed circuit board materials will permit the use of higher temperature solders for attachment. Nevertheless, it is expected that the solder balls on the flip-chip die will be inadequate in volume to provide reliable attachment, in the absence of additional solder on the boards as provided by the present invention.

The refinements introduced by the present invention will become particularly valuable as the industry progresses to finer pitch contact patterns in that the invention provides a fundamental procedure for depositing solder in fine pitch patterns without complex plating processes or exotic molten solder dispensing equipment. In addition, the process is fully compatible with conventional surface mount technology equipment and methods of operation as used to manufacture populated circuit boards. Lastly, the process allows for the manufacture of printed circuit boards relatively independent of the manufacturing processes by which components are mounted.

Although the invention has been described and illustrated by way of specific embodiments, the methods and products encompassed by the invention should be interpreted in keeping with the breadth of the claims set forth hereinafter.

We claim:

1. An intermediate level printed circuit board product, comprising:

a dielectric structure core;

a conductive interconnect layer with fine and course pitch contacts configured to connect surface mounted components of corresponding contact pitch on at least one surface of the dielectric structure core;

solder reflowed onto conductive layer fine pitch contacts as defined by openings in a first stencil, the reflowed solder characterized in having an origin composition of solder paste screen deposited into fine pitch openings in the first stencil and further characterized in having a shape constrained by a reflow performed at an elevated temperature in the presence of the first stencil;

solder paste screen deposited on conductive layer coarse pitch contacts as defined by coarse pitch openings in a second stencil, having a pattern different than the first stencil, during a solder paste screen deposition following removal of the first stencil, wherein the fine pitch contacts formed using the first stencil are finer by a factor of two or more than the coarse pitch contacts defined by the solder paste deposited using the second stencil;

first components affixed to select conductive layer fine pitch contacts using flux deposited on the reflowed solder; and second components affixed to select conductive layer coarse pitch contacts using the screen deposited solder paste as defined by the second stencil.

* * * * *